METHOD OF MAKING SEMICONDUCTOR DIODES

Original Filed Feb. 3, 1969 2 Sheets-Sheet 1

INVENTOR
WARREN C. ROSVOLD

BY [signature]
AGENT

July 17, 1973 W. C. ROSVOLD 3,746,587

METHOD OF MAKING SEMICONDUCTOR DIODES

Original Filed Feb. 3, 1969 2 Sheets-Sheet 2

INVENTOR

BY [signature]

AGENT

United States Patent Office 3,746,587
Patented July 17, 1973

3,746,587

METHOD OF MAKING SEMICONDUCTOR DIODES

Warren C. Rosvold, Sunnyvale, Calif., assignor to Raytheon Company, Lexington, Mass.

Continuation of abandoned application Ser. No. 795,977, Feb. 3, 1969. This application Nov. 4, 1970, Ser. No. 86,960
Int. Cl. H01l 7/36, 7/00, 3/00
U.S. Cl. 148—175 7 Claims

ABSTRACT OF THE DISCLOSURE

A method of making a number of semiconductor diodes on a single wafer without breakage during handling and processing, comprising the steps of forming a plurality of mesas on one surface of an intrinsic substrate, diffusing a selected first conductivity-type region into each mesa, coating the front surface of the substrate and mesas with oxide, chemically milling recesses into the opposite side of the substrate in alignment with the mesas to a predetermined depth where the mesas are each supported by a thin annular area of substrate material permitting transfer of the device into an epitaxial reactor, gas etching the recesses to a depth beyond the oxide interface to physically separate the mesas from the substrate material, growing a thin epitaxial layer of opposite conductivity type over the back surface of the device, applying ohmic contacts to the device, and separating the individual mesas.

CROSS REFERENCE TO RELATED APPLICATION

This application is a continuation of application Ser. No. 795,977, Feb. 3, 1969, now abandoned.

BACKGROUND OF THE INVENTION

Semconductor diodes, when made in production quantities, generally have been made by utilizing conventional etching procedures to form a plurality of diode devices within a single substrate. In such techniques it also has been necessary to utilize mechanical lapping and polishing procedures to provide the devices with predetermined thicknesses. The resultant devices at some stages in the manufacturing process are delicate and fragile and, therefore, easily damaged or broken, resulting in poor production quantities. Furthermore, mechanical procedures for controlling thicknesses have not only been conducive to such damage but also have not proved to be suitable for establishing precise and reproducible thicknesses.

SUMMARY OF THE INVENTION

This invention overcomes the foregoing and other disadvantages of known methods of producing semiconductor diodes by the provision of a novel combination of manufacturing steps which enables high quantity production of semiconductor diodes without damage or breakage usually caused by handling and processing of fragile elements. Mechanical processes for establishing device thicknesses are, furthermore, eliminated whereby diodes may be made to more precise dimensions than previously possible.

The above advantages are achieved by chemically etching mesas in a selected intrinsic semiconductor substrate whereby circumferential dimensional configuration of the diodes is established, gaseous etching which establishes thickness dimensions of the diodes, and diffusion and epitaxial deposition steps which precisely form conductivity regions of exacted predetermined dimensions, all without necessity for mechanical processing.

More specifically, the method of the present invention comprises the steps of etching a plurality of spaced mesas in an intrinsic semiconductor substrate, diffusing a first conductivity-type region in each mesa, coating the mesas and adjacent surrounding surfaces of the substrate with oxide, chemically milling recesses in the opposite side of the substrate opposite respective mesas to a depth whereby thin annular areas of intrinsic material surround and support the mesas for transfer to an epitaxial reactor, gas etching the recesses to a depth beyond the oxide interface to establish mesa thicknesses and to physically separate the mesas from the substrate by removal of the annular supporting areas, epitaxially growing an opposite-conductivity-type layer of predetermined thickness on the recessed side of the device, applying ohmic contacts to the device, and separating the diodes into individual units by breaking through the thin areas of the epitaxial layer.

BRIEF DESCRIPTION OF THE DRAWINGS

The foregoing and other objectives of this invention are achieved by the method disclosed in the following description taken in connection with the accompanying drawings, wherein.

DESCRIPTION OF THE PREFERRED EMBODIMENTS

Figure 1:
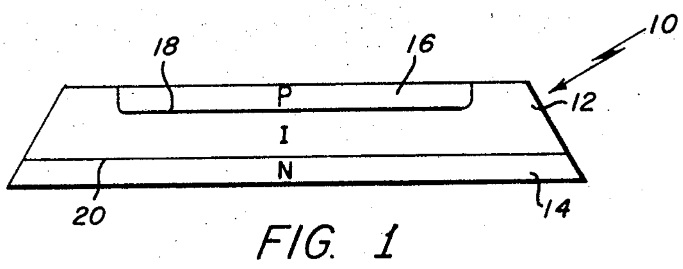
FIG. 1 is an elevational view of a semiconductor diode made by the method of this invention, without contacts or passivation coatings.

Referring to the drawings, wherein like characters of reference designate like parts throughout the several views, a microwave or P–I–N diode 10 is shown in FIG. 1 and comprises a basically intrinsic wafer or disc 12 having an N-type region 14 on one side thereof and a P-type region 16 on its opposite side, with the intrinsic region completely separating the two regions 14 and 16. In a completed structure, contacts are made to the regions 14 and 16 so that the device may be suitably connected into associated circuitry. A first barrier or junction 18 lies between regions 12 and 16, and a second barrier or junction 20 lies between regions 12 and 14. The single crystal silicon chip or wafer has a thickness and resistivity in accordance with the device requirements, that is, which establishes the capacity of the diode and, consequently, the operating frequency. It has been found that for a range of from about 500 volts to about 1000 volts the thickness should be about 100–200 microns and the resistivity should be about 300 ohms-cm.

When making an intrinsic wafer, it is necessary to provide a dopant in extremely small amounts which will provide the desired resistivity. Ordinarily, the term "intrinsic" refers to a pure or nearly pure silicon crystal. However, the term broadly refers to a crystal which is not absolutely pure but which contains very slight amounts of an impurity which tends to make the intrinsic layer slightly N-type or P-type, depending upon the type of impurity or dopant used. For example, when growing the crystal from a seed of N-type or P-type material, in the absence of additional impurity-introducing agents the crystal will inherently become slightly N-type or P-type depending upon the type of seed employed. This is well known in the semiconductor industry and, therefore, it is not believed necessary to go into further discussion here of the intrinsic wafer other than to point out that, as the amount of impurity increases, the resistivity decreases.

The crystal ingot from which the wafer is grown is sliced in the [100] crystallographic plane, said plane having the [100] crystallographic axes extending normal thereto, and a flat is ground at one edge of the wafer normal to the [100] plane. The flat is used for alignment of the wafer in the proper crystallographic orientation during subsequent procedure. The wafer is processed by conventional lapping, polishing and etching steps to a desired resultant size, such as about 15 mils in thickness and one inch in diameter, for example. This wafer, during subsequent processing, becomes the intrinsic layers of regions 12 of all the diodes being processed on the single substrate.

The wafer processed as above described is then treated to provide thereover a layer of silicon oxide, or other insulating coating, of a thickness of about 20,000 A., this being done by any conventional thermal growing or other oxidation process as is well known in the art. A mesa etch pattern is then defined on one surface of the wafer utilizing well-known photoresist techniques. The particular masking technique used here is not in itself unique insofar as this invention is concerned and, therefore, will only be briefly described herein. A photographic film is prepared with the desired pattern thereon, and the wafer is provided, over the oxide, with a coating of photoresist material, such as the solution known as KPR sold under that terminology by Eastman-Kodak Co., for example. One surface of the wafer is exposed through the film to ultra-violet or other radiation to which the photoresist is sensitive, and developing takes place by dipping the wafer in a solution such as trichloroethylene to remove unsensitized KPR. The wafer is then baked at about 150° C. for about ten minutes, whereupon the oxide supports thereon a resultant hardened photoresist mask having the desired configuration of the diodes to be formed in accordance with this invention.

The wafer is then placed in a solution containing about one part of hydrofluoric acid (HF) and nine parts of ammonium fluoride (NHF) to etch away the exposed areas of silicon dioxide, following which it is rinsed in water and dried. The photoresist pattern may now be removed by subjecting it to a solution of one part sulphuric acid and nine parts of nitric acid at about 100° C. for about ten minutes. This leaves the oxide mask overlying the surfaces where mesas are to be formed in the substrate, which mesas will each correspond to the individual diodes which are being made in the wafer. The last photoresist removal step may be omitted if desired, however, because the photoresist will be automatically removed in the following etching process.

The mesas now are formed by a preferential etching or precision chemical milling technique. This is done by placing the wafer in a suitable rack and heating it in boiling water to preheat it to the temperature of the etching solution, that is, about 115° C. The etching solution may be a saturated solution, i.e., at least 25% of sodium hydroxide (NaOH) in water, preferably in an amount of 33%. The preheated wafer is subjected to the etchant for the time necessary to etch the exposed surfaces of the intrinsic layer to remove material down to a depth suitable to establish the initial thickness of the mesas. A suitable mesa thickness of about 150 microns is achieved by etching for about 30 minutes.

Figure 2:
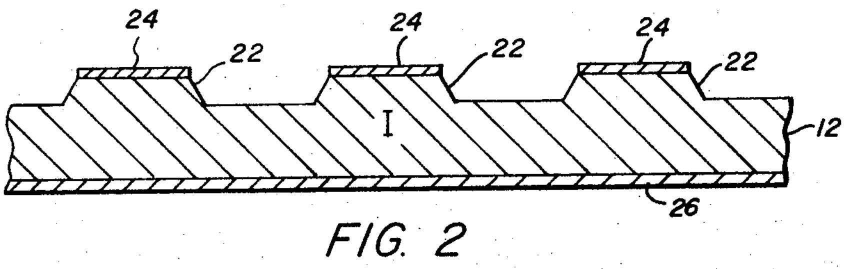
FIGS. 2–7 are horizontal sectional views illustrating various steps in the process of the invention.

The wafer at this point appears substantially as shown in FIG. 2 wherein the intrinsic wafer material is indicated by numeral 12 and is shown with a number of mesas 22 extending upwardly from one surface thereof the tops of the mesas still retaining the etchant resistant oxide or other coating 24 thereon. A similar coating 26 covers the back side of the wafer.

It will be noted that the aforedescribed etching takes place from the [100] plane surface of the wafer and proceeds in the [100] direction or along the [100] crystallographic axes of the single crystal material. The sides of the mesas will be inclined at an angle of about 54.7° because of the resistance created by the [111] planes of the crystal material. This particular etching procedure enables all the mesas 22 to be precisely formed and all are truly identical.

Figure 3:
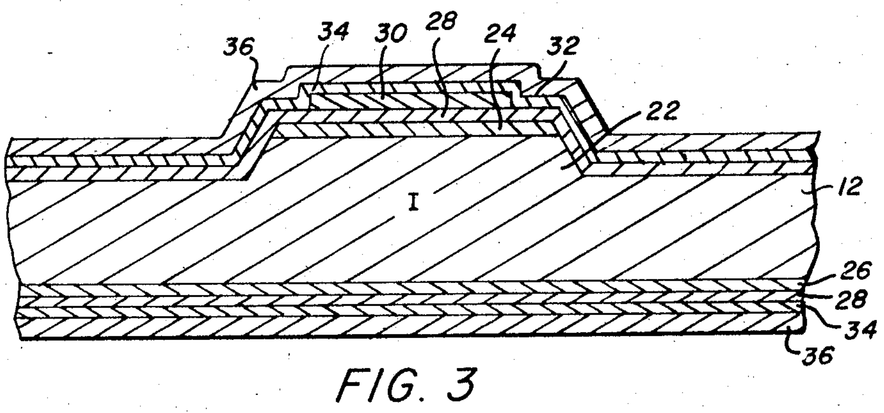

The structure shown in FIG. 2 is then covered by oxide 28, preferably by thermal oxidation as described above, to a thickness of approximately 35,000 A., as seen in FIG. 3. Then a silver pattern is deposited in discrete circular areas 30 on the top of each mesa, with the periphery of each silver area 30 being disposed inwardly from the edge of the respective mesa so that a narrow annular surface or rim 32 remains uncovered by silver around each silver area 30 adjacent the edge of the mesa. This silver pattern is applied by evaporating silver about 3000 A. thick over the entire top surface of the device and then etching the silver pattern by masking with photoresist as described above.

Then successive layers of chrome 34 and gold 36 are evaporated over the entire upper surface of the structure, as shown in FIG. 3. The chrome layer 34 is preferably about 200 A. thick and the gold layer 36 is evaporated to a thickness of about 4000 A. The silver areas 30 are now removed with a solvent such as hydrogen peroxide and hydrofluoric acid. This process takes advantage of the fact that the chrome-gold deposit 34–36 has poor adhesion to silver but adheres excellently to oxide. Because the chrome-gold over the silver is very porous, the solvent can reach the silver relatively easily and remove it, thus also lifting off the chrome-gold in these areas. Then the oxide which is exposed by removal of the silver is etched away, using the residual chrome-gold as a mask. The oxide may be removed by a suitable etchant as is well known, such as a dilute hydrofluoric acid mixture.

Figure 4:
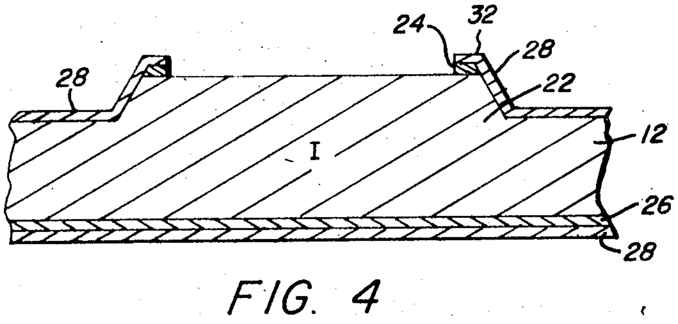

Following this, the residual chrome-gold is etched away using suitable etchants to which these metals are susceptible, such as potassium iodate for the gold and hydrochloric acid for the chrome. This, then, provides a structure which comprises the intrinsic layer 12 having mesas 22 thereon and having oxide on all surfaces except the relatively small exposed circular areas on the tops of the mesas. It should be noted that the annular oxide rims 32 outline the exposed circular areas of the mesa top surfaces. This is shown in FIG. 4.

Figure 5:
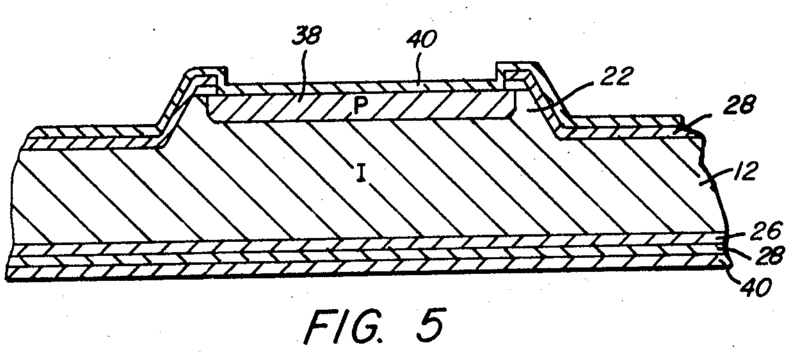

At this point in the process, a P-type diffusion is made into the upper surfaces of the mesas 22 through the openings in the oxide. Briefly, this may be done by diffusing boron or other P-type dopant from a gas phase in a furnace at about 1100° C. for about 15 minutes, then subjecting the device to dry oxygen at a temperature of about 1100° C. for about 25 minutes to drive the boron into the intrinsic layer 12 to a depth of about 2–3 microns, for example. This forms a P-region 28 in the device, after which a 7000 A. thick layer 40 of oxide is grown over the device for protection of the P-region 28 during subsequent processing. The device now appears as shown in FIG. 5.

Using standard photoresist techniques as described above, oxide is removed in selected areas from the back or bottom side of the device to form opposite each mesa 22 a window having a size somewhat larger than the diameter of the mesa and through which the bottom of the intrinsic region 12 is exposed.

Figure 6:
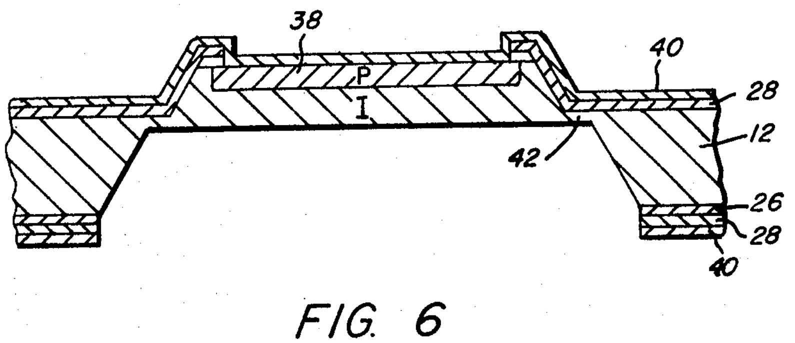

The intrinsic region 12 is then preferentially etched through the windows to remove silicon down to a point where the mesas 22 are joined to the intrinsic layer 12 by only a very thin annular area 42 surrounding the base of each mesa, as shown in FIG. 6. This etching step is accomplished by a process similar to the process described above in connection with the mesa formation whereupon etching of the back surface of the device is accomplished to a depth suitable to establish the desired thickness of the annular areas 42. This thickness may be about one-half milimeter from the oxide 28. This results in the production of thin, annular silicon areas 42 which are of approximately the specified thickness so that the mesas will be supported during subsequent transfer of the device to a reactor (not shown).

Figure 7:
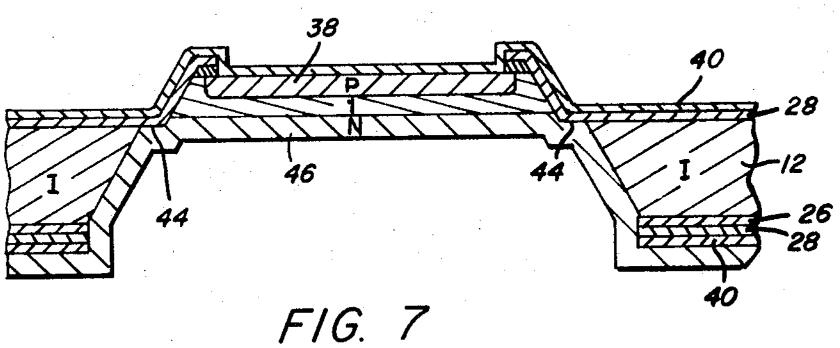

In the reactor, the backside etched holes or recesses in the intrinsic region 12 are further etched in hydrochloric gas so that silicon is removed to a level about five microns beyond the oxide interface (FIG. 7), thus also removing annular areas 42. This is preferably done in an epitaxial reactor because, with conventional chemical milling or etching procedures, the resultant annular oxide membrane 44 will usually break because of dissimilar expansion with the bulk silicon. In a reactor, the temperatures utilized for etching and deposition silicon can be made the same as the temperature which was utilized for the oxide growing steps, thus placing the $SiO_2$-Si system at mechanical equilibrium.

Immediately after the last above-mentioned etching step is completed, an N-type epitaxial layer 46 is grown over the back side of the device about 12 microns in thickness. This may be done, without removal of the device from the reactor, by conventional, well-known epitaxial deposition which may be briefly described as reacting a silicon compound such as silicon tetrachloride, silane, or tetraorthosilicate with a reducing compound, such as hydrogen, for example, in vapor form onto the surfaces of the intrinsic region 12 and the adjacent oxide deposits, for about 12–20 minutes to produce a thickness of about 25 microns. Layer 46 is doped with arsenic, antimony, phosphorus or other N-type dopant in an amount sufficient to provide it with a resistivity of about .01 ohm cm., for example.

At this point, ohmic contacts are formed. The thin oxide covering the P-region 38 is removed by known techniques and nickel is evaporated onto both sides of the device to a thickness of about 1000 A. and sintered at about 800° C. Then, after any spurious nickel is cleaned off, a plating of nickel is applied to a thickness of about 1000 A. over the evaporated nickel layer. Following this, the nickel is covered by a gold plate about 1000 A. thick to which leadouts may subsequently be connected.

This completes the fabrication of the diodes, which may then be separated from the supporting substrate by punching them out, with severing occurring at the thin annular areas where the diodes are attached to the thick substrate.

It will be apparent from the foregoing description that a novel process has been achieved for producing semiconductor diodes of the P-I-N type. It is to be understood, however, that various modifications and changes may be made in the process steps disclosed without departing from the spirit of the invention as expressed in the accompanying claims.

I claim:

1. A method of making a plurality of separable semiconductor diodes on a single wafer, comprising the steps of:

etching one side of a wafer of intrinsic semiconductor material to form a plurality of mesas thereon;

covering said one side of the water with a layer of insulating material;

diffusing a selected conductivity-type material into the tops of the mesas through windows in the layer of insulating material to provide in each mesa a semiconductor region of said selected conductivity type;

etching the opposite side of the wafer opposite respective mesas to form depressions having depths which extend beyond the layer of insulating material at the bottom edges of the mesas;

applying a layer of opposite conductivity-type semiconductor material over the bottoms of the mesas within said cavities to provide each mesa with a semiconductor region of said opposite conductivity type;

providing said regions with ohmic contacts; and separating the resultant individual diodes from the wafer.

2. A method of making a plurality of separable semiconductor diodes on a single wafer, comprising the steps of:

providing a wafer of intrinsic semiconductor material having its [100] crystallographic plane parallel with its front and back surfaces;

etching the front surface of the wafer in the [100] direction to form a plurality of mesas thereon;

covering said front surface of the wafer with a layer of insulating material;

diffusing a selected conductivity-type material into the tops of the mesas through windows in the layer of insulating material to provide in each mesa a semiconductor region of said selected conductivity type;

etching the opposite side of the wafer in the [100] direction opposite respective mesas to form depressions having depths which extend beyond the layer of insulating material at the bottom edges of the mesas;

applying a layer of opposite conductivity-type semiconductor material over the bottoms of the mesas within said cavities to provide each mesa with a semiconductors region of said opposite conductivity type;

providing said regions with ohmic contacts; and separating the resultant individual diodes from the wafer.

3. A method of making a plurality of separable semiconductor diodes on a single wafer, comprising the steps of:

etching one side of a wafer of intrinsic semiconductor material to form a plurality of mesas thereon;

covering said one side of the wafer with a layer of insulating material;

diffusing a selected conductivity-type material into the tops of the mesas through windows in the layer of insulating material to provide in each mesa a first semiconductor region of said selected conductivity type;

chemically etching the opposite side of the wafer opposite respective mesas to form depressions therein extending inwardly to a level where the mesas are supported by a relatively thin area of intrinsic material surrounding the base of each mesa;

transferring the wafer to an epitaxial reactor;

further etching said depressions in gas to provide the depressions with depths which extend beyond the layer of insulating material at the bottom edges of the mesas whereby the mesas are then joined to the remainder of the wafer only by areas of the insulating material surrounding the bases of the mesas;

epitaxially growing a layer of opposite conductivity-type semiconductor material over the bottoms of the mesas within said cavities without removing the wafer from the reactor to provide each mesa with a second semiconductor region of said opposite conductivity type;

providing said regions with ohmic contacts; and separating the resultant individual diodes from the wafer.

4. The method set forth in claim 3 wherein said diffusing step is effected with material having P-type conductivity whereby said first region will be of P-type conductivity; and said epitaxial growth step is effected with N-type conductivity material whereby said second region is of N-type conductivity.

5. A method of making a plurality of separable semiconductor diodes on a single wafer, comprising the steps of:

providing a wafer of intrinsic semiconductor material having its [100] crystallographic plane parallel with its front and back surfaces;

etching the front surface of the wafer in the [100] direction to form a plurality of mesas thereon;

covering said front surface of the wafer with a layer of insulating material;

diffusing a selected conductivity-type material into the tops of the mesas through windows in the layer of insulating material to provide in each mesa a semiconductor region of said selected conductivity type;

chemically etching the opposite side of the wafer in the [100] direction opposite respective mesas to form depressions therein extending inwardly to a level where the mesas are supported by a relatively thin area of intrinsic material surrounding the base of each mesa;

transferring the wafer to an epitaxial reactor;

further eaching said depressions in gas to provide the depressions with depths which extend beyond the layer of insulating material at the bottom edges of the mesas whereby the mesas are then joined to the remainder of the wafer only by areas of the insulating material surrounding the bases of the mesas;

epitaxially growing a layer of opposite conductivity-type semiconductor material over the bottoms of the mesas within said cavities without removing the wafer from the reactor to provide each mesa with a semiconductor region of said opposite conductivity type;

providing said regions with ohmic contacts; and separating the resultant individual diodes from the wafer.

6. A method of making a plurality of separable semiconductor diodes on a single wafer, comprising the steps of:

etching one side of a wafer of intrinsic semiconductor material to form a plurality of mesas thereon;

covering said one side of the wafer with a layer of insulating material;

providing the central area of the top of each mesa with a layer of silver;

applying successive layers of chrome and gold over the said one side of the wafer and over the silver areas;

removing the silver areas and the chrome and gold areas which overlie the silver areas to expose the insulating material which covers the central area of the tops of the mesas and to provide a chrome-gold mask surrounding said exposed areas of insulating material;

removing the exposed areas of insulating material;

diffusing a selected conductivity-type material into the tops of the mesas through the resultant openings in the layer of insulating material to provide in each mesa a semiconductor region of said selected conductivity type;

chemically eaching the opposite side of the wafer opposite respective mesas to form depressions therein extending inwardly to a level where the means are supported by a relatively thin area of intrinsic material surrounding the base of each mesa;

transferring the wafer to an epitaxial reactor;

further etching said depressions in gas to provide the depressions with depths which extend beyond the layer of insulating material at the bottom edges of the mesas whereby the mesas are then joined to the remainder of the wafer only by areas of the insulating material surrounding the bases of the mesas;

epitaxially growing a layer of opposite conductivity-type semiconductor material over the bottoms of the mesas within said cavities without removing the wafer from the reactor to provide each mesa with a semiconductor region of said opposite conductivity type;

providing said regions with ohmic contacts; and separating the resultant individual diodes from the wafer.

7. The method set forth in claim 6 wherein said diffusing step is effected with material having P-type conductivity whereby said first region will be of P-type conductivity; and said epitaxial growth step is effected with N-type conductivity material whereby said second region is of N-type conductivity.

References Cited

UNITED STATES PATENTS

| | | | |
|---|---|---|---|
| 3,270,255 | 8/1966 | Nakatogawa et al. | 317—234 |
| 3,311,963 | 4/1967 | Abe | 148—1.5 X |
| 3,341,379 | 9/1967 | Yasufuku et al. | 148—187 |
| 3,345,222 | 10/1967 | Nomura et al. | 148—175 |
| 3,370,209 | 2/1968 | Davis et al. | 317—235 |
| 3,397,448 | 8/1968 | Tucker | 29—577 |
| 3,432,919 | 3/1969 | Rosvold | 156—17 |
| 3,447,235 | 6/1969 | Rosvold et al. | 148—175 X |

L. DEWAYNE RUTLEDGE, Primary Examiner

W. G. SABA, Assistant Examiner

U.S. Cl. X.R.

117—201, 212; 148—1.5, 174; 156—17; 317—235 R